United States Patent
Swamy

(10) Patent No.: US 6,686,759 B1
(45) Date of Patent: Feb. 3, 2004

(54) TECHNIQUES FOR TESTING EMBEDDED CORES IN MULTI-CORE INTEGRATED CIRCUIT DESIGNS

(75) Inventor: Janardhana Swamy, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 386 days.

(21) Appl. No.: 09/727,328

(22) Filed: Nov. 28, 2000

(51) Int. Cl.[7] .................. G01R 31/26; G01R 31/28; H04J 15/00
(52) U.S. Cl. ............ 324/765; 324/76.63; 714/726
(58) Field of Search ................ 324/765, 537, 324/73.1, 158.1, 76.59, 76.63, 76.64, 76.15; 714/726, 727, 730, 742, 743

(56) References Cited

U.S. PATENT DOCUMENTS

| | | | | |
|---|---|---|---|---|
| 5,477,545 A | * | 12/1995 | Huang ................. | 324/158.1 X |
| 5,862,152 A | * | 1/1999 | Handy et al. ............. | 371/22.32 |
| 6,115,763 A | * | 9/2000 | Douskey et al. .............. | 710/72 |
| 6,311,302 B1 | * | 10/2001 | Cossetti et al. ............. | 714/727 |
| 6,378,093 B1 | * | 4/2002 | Whetsel ....................... | 714/726 |
| 6,425,100 B1 | * | 7/2002 | Bhattacharya ............... | 714/724 |
| 6,446,230 B1 | * | 9/2002 | Chung ......................... | 714/726 |
| 6,492,798 B2 | * | 12/2002 | Sunter ..................... | 324/76.15 |

OTHER PUBLICATIONS

Downey et al. (Emerging standards for manufacturing test of system–on–chip design, Authors: Downey, D.; Lysaght, P.; Systems on a Chip (Ref. No. 1999/133), IEE Colloquium on, Sep. 16, 1999 pp.: 10/1–10/7).*

Dervisoglu, Bulent, et al., "A Novel Approach for Designing Hierarchical Test Accesss Controller for Embedded Core Designs in an SoC Environment."

Whetsel, Lee, "An IEEE 1149.1 Based Test Acces Architecture For IC's With Embedded Cores," Proceedings International Test Conference 1997, pp. 69–78.

Bhattacharya, Debashis, "Hierarchical Test Access Architecture for Embedded Cores in an Integrated Circuit," Proceedings 16th IEEE VLSI Test Symposium, Apr. 26–30, 1998, pp. 8–14.

Bhattacharya, Debashis, "Insruction–Driven Wake–Up Mechanisms for Snoopy TAP Controller," Proceedings 17th IEEE VLSI Test Symposium, Apr. 25–29, 1999, pp. 467–472.

* cited by examiner

Primary Examiner—Anjan K. Deb
(74) Attorney, Agent, or Firm—Bingham McCutchen LLP

(57) ABSTRACT

A system and method for testing an integrated circuit including one or more circuit blocks, each containing an internal core, and a test access port connected to a set of boundary-scan cells includes a select register for receiving and holding the address of a circuit block to be accessed. One or more demultiplexers provide an interface between input test access port signals and the various individual circuit blocks, and one or more multiplexers provide an interface between the various individual circuit blocks and the output test access port signals. The address bits read into the select register act as the select signal(s) for the one or more demultiplexers and multiplexers, causing input test access port signals to be selectively routed to the circuit block having the appropriate address and causing output signals to be selected from the same circuit block as the output test access port signals.

29 Claims, 8 Drawing Sheets

USE OF POWER-UP RESET FOR TEST LOGIC

TECHNIQUES FOR TESTING EMBEDDED CORES IN MULTI-CORE INTEGRATED CIRCUIT DESIGNS

BACKGROUND OF THE INVENTION

1. Field of the Invention

The field of the present invention generally relates to electronic design automation and testing of integrated circuits, and, more particularly, to methods and systems for testing embedded cores in complex, multi-core integrated circuit designs.

2. Background

Chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions) using specialized placement and routing software, resulting in a physical layout file. A mask file, for example a GDSII or CIF format, may be provided to a foundry, and contains enough information to allow the foundry to manufacture an actual integrated circuit therefrom.

At various stages of the design process, validation of the design may be desired through test or verification procedures. To test a design, a set of test vectors is ordinarily generated which will be applied to the inputs to the design and compared against the outputs of the design. An error in the design will be indicated if the actual output generated by the design does not match the expected output. A test access port (TAP) is usually provided on-chip for receiving input test data from a test data source and outputting output test data from the integrated circuit. The test access port is generally used for testing an integrated circuit during and after the manufacturing of the integrated circuit. Another common use of the test access port is on a printed circuit board (PCB) where interconnectivity between multiple components (ICs) can be verified in addition to testing the individual components (ICs). The test access port is generally connected to a serially linked set of boundary-scan cells, one such cell for each input and output pin of the integrated circuit. The test access port controls the inflow and outflow of information with respect to the boundary-scan cells, and hence with respect to the integrated circuit core.

Test and verification processes are facing new challenges due to changes in integrated circuit (IC) design. In particular, decreases in the feature size of circuit elements has led to the ability to place more components on a single integrated circuit. At the same time, decreases in design cycle time are being sought, in order to allow faster time-to-market and hence a potential competitive advantage. Due in part to these trends, the current trend in integrated circuit core design is to create more and more complex cores capable of being stored on a single IC. Design cores that were previously whole ICs have now been reduced to sizes allowing their use as individual components of complex ICs containing multiple design cores.

Another trend in the integrated circuit design industry is to reuse pre-existing circuit blocks in a new design, particularly in multi-core integrated circuits, in order to reduce the development time of an integrated circuit. The pre-existing circuit blocks may be "soft" or "hard", or somewhere in between. A "soft" circuit block is one that has not been physically laid out, while a "hard" circuit block has its physical layout already determined (i.e., placement and routing of its internal components has been achieved). Pre-existing circuit blocks may occasionally be referred to as "VCs" (short for "Virtual Components") or "IPs" (short for "Intellectual Properties," suggesting their proprietary nature to particular designers). Often, pre-existing circuit blocks will include their own individual test access port to allow testing of the IP itself, assuming the test access port is accessible through chip-level pins after the pre-existing circuit block is placed in a larger integrated circuit design.

The state-of-the-art approach to complex IC design involves system development using pre-existing circuit cores (e.g., VCs or IPs) which have already been individually tested using manufacturer developed test vectors. Often, a basic IC platform is developed, and as the design functionality is expanded more pre-existing circuit cores are added to the hierarchy of the design. Reuse of pre-existing integrated circuit cores generally raises the possibility of using the existing manufacturing level test vectors to further reduce total design and verification time. Investing time in developing new test vectors when test vectors already exist for a given virtual component block would defeat the goal of reducing the time-to-market through partial design reuse. This is particularly true if the reused virtual component block is already hardened, leaving little or no room to generate different test vectors.

As the design size and complexity of integrated circuits has increased, the time necessary to develop manufacturing level test vectors has also increased significantly, causing increased delays in delivering the chips to market. To complicate matters further, the widely accepted IC test standard, Standard 1149.1 promulgated by the Institute of Electrical and Electronics Engineers (IEEE), cannot be used directly in ICs containing embedded cores with built-in test access ports. The 1149.1 standard was formulated with the goal of allowing one test access port per chip, and does not take into account the possibility of chip designs containing multiple embedded cores, some of which may already have built-in 1149.1 compliant test access ports. This problem is becoming increasingly significant as the 1149.1 test standard has reached widespread acceptance in the electronics and semiconductor industries, making it highly desirable that current and future ICs be fully compliant with the standard.

Use of existing or even new test vectors to test the individual cores inside multi-core integrated circuits poses difficult challenges because the individual cores are embedded within the chip, with limited or no direct pin access exterior to the chip itself. When the multi-core integrated circuits are manufactured, only necessary external connectivity is maintained; therefore, many of the pins of the of the individual circuit blocks are partially or completely inaccessible from outside the chip. Because external connectivity to each pin of the individual circuit blocks cannot be provided, testing individual circuit blocks by applying a set of test vectors to the manufactured multi-core integrated circuit designs can be problematic. Further, even if the circuit blocks have boundary-scan (BS) ports, and even if the test vectors are designed to test the individual circuit blocks through their boundary-scan ports, it is neither feasible nor efficient to bring the connectivity of the entire boundary-scan port of all such circuit blocks out to the edge of the chip because this would significantly increase the number of test pins at the chip level.

Various methodologies have recently been proposed to address the difficulties associated with testing the embedded cores in complex ICs while still adhering to the IEEE 1149.1 standard. One approach, for example, is described in Lee Whetsel, "An IEEE 1149.1 Based Test Access Architecture for ICs With Embedded Cores," *Proc. International Test Conference*, 1997, pp. 69–78, hereby incorporated by reference as if set forth fully herein. The approach detailed in this article, while directed to the problems associated with testing embedded IC cores, requires modification to the existing test access port (TAP) controllers in the circuit blocks, including a large amount of logic (resulting in modified TAP controllers) at each level of core hierarchy. Other methodologies not requiring modifications to existing test access port controllers, and directed primarily to designs having pre-hardened blocks, may require the addition of a modified TAP controller (known as an HTAP) at each circuit block hierarchy level. Such an approach is described in D. Bhattacharya, "Hierarchical Test Access Architecture for Embedded Cores in an Integrated Circuit," *Proc. VLSI Test Symposium*, 16th *IEEE*, 1998, pp. 8–14, hereby incorporated by reference as if set forth fully herein. The aforementioned conventional approaches may require increased engineering time and effort, due to the complexity of the implementation involved, and may further require specialized software tools.

Another method for testing embedded cores in complex ICs makes use of multiplexers (MUXs) to select a desired circuit block containing the core to be tested. With this approach, the number of select pins needed for multiplexing is generally $log_2N$, rounded up, where N is the number of embedded cores to be tested in the design. Thus, for example, four select pins would be necessary to select one of nine circuit blocks containing an embedded core within a chip, since $log_2 9$ rounded up is 4. While allowing access to different embedded cores, this technique can be undesirable because it requires a number of chip test pins proportional to the number of cores embedded in the integrated circuit, which becomes inefficient for complex designs containing large numbers of embedded cores.

A need thus exists for a scaleable, efficient mechanism to access embedded cores for testing in complex ICs, particularly one that is compatible with the IEEE 1149.1 standard, that requires minimal design and area overhead, and that interfaces easily with pre-existing individual circuit blocks having standard test access port interfaces (without requiring any modifications to the existing circuit blocks). A need further exists for a technique to test reused or derivative designs which are connected in a hierarchy, without requiring modification of the pre-existing designs or test vectors.

SUMMARY OF THE INVENTION

The invention provides in one aspect a method and system for testing multiple-core integrated circuits that can be compatible with the IEEE 1149.1 standard test access port of each circuit block containing an internal core.

In one embodiment as disclosed herein, a system and method are provided for testing an integrated circuit comprising one or more circuit blocks, each containing an internal core, and a test access port (e.g., an IEEE standard 1149.1 compliant test access port) preferably connected to a set of boundary-scan cells. A Select Register (preferably a serial register) is added to the integrated circuit, the purpose of which is to receive and hold the address of a circuit block to be accessed in order to test the internal core of the circuit block. Each circuit block is preferably assigned a unique address. One or more demultiplexers are added to the integrated circuit to provide an interface between input test access port signals and the various individual circuit blocks, and one or more multiplexers are added to the integrated circuit to provide an interface between the various individual circuit blocks and the output test access port signals. The address bits read into the Select Register act as the select signal(s) for the one or more demultiplexers and multiplexers. In response to the select signal(s) (i.e., the address bits), the input test access port signals are selectively routed (via the demultiplexer(s)) to the circuit block having the appropriate address, and output signals from the same circuit block are selected (via the multiplexer(s)), from among the output signals of all of the circuit blocks, as output test access port signals. By changing the address in the Select Register, the internal cores of the individual circuit blocks within the overall integrated circuit design can be systematically selected for testing.

In another embodiment, the above technique is expanded for use in a hierarchical integrated circuit design, wherein circuit blocks are divided into groupings at different hierarchical levels. In this embodiment, multiple Select Registers are added to the integrated circuit, a Select Register at each level of the hierarchical design for each group of circuit blocks. At the highest or top-level hierarchy in an integrated circuit one or more demultiplexers are added to provide an interface between input Test Access Port signals and the various individual circuit blocks or lower-level hierarchies, and one or more multiplexers are added to provide an interface between the various individual circuit blocks or lower-level hierarchies and the output Test Access Port signals. Similarly, at the lower hierarchical levels, one or more demultiplexers are added to provide an interface between lower-level Test Access Port input signals and the lower-level circuit blocks, thereby allowing the output (or outputs) of the top-level demultiplexer (or demultiplexers) to reach the various individual circuit blocks or next lower-level hierarchy. One or more multiplexers are also added at the lower-level hierarchies to provide an interface between the lower-level circuit blocks or the next lower-level hierarchy and lower-level Test Access Port output signals, thereby allowing the output (or outputs) of the lower-level circuit blocks or lower-level hierarchies to reach input (or inputs) of the top-level multiplexer (or multiplexers). In this embodiment, the address bits read into the top-level Select Register act as the select signal(s) for the one or more top-level demultiplexers and multiplexers, and the address bits are passed through from the top-level Select Register to the lower-level Select Register(s) so that the proper lower-level circuit block or next lower-level hierarchy can also be selected. In response to the select signal(s) (i.e., the address bits), the input Test Access Port signals are selectively routed via the top-level and/or lower-level demultiplexers to the circuit block at the designated hierarchical level having the designated address. Output signals from the same circuit block are also simultaneously selected as output Test Access Port signals (via the lower-level and/or top-level multiplexers) from among the output signals of all the circuit blocks. By changing the address in the top-level and/or lower-level Select Registers, the internal cores of the individual circuit blocks within the overall integrated circuit design can be systematically selected for testing.

In certain embodiments, the internal core of any circuit block or multiple circuit blocks embedded in an integrated circuit or chip may be selected for testing by loading the corresponding address bits of the circuit block containing the core into the Select Register (or Select Registers). To test the selected core, test vectors may be scanned into the boundary-scan registers of the internal core. The test stimuli are applied in parallel to the selected core, and the response of the internal core is captured in parallel by the appropriate boundary-scan registers and scanned out through the test access port for test analysis.

In various embodiments, all bits of the Select Register(s) can be cleared either by a system power-up or by a Test Reset signal, causing the highest level circuit block (in a hierarchical test structure) to become the selected default. In other embodiments, the Test Reset signal to the Select Registers can be omitted in order to prevent the Select Register(s) from being reinitialized during power up, leaving the Select Register(s) with an undetermined value at initial state. A known data value can then be moved into the circuit block Select Register at a later time in order to select a circuit block for testing. Omitting the test reset event prior to loading the address bits of a new circuit block also allows the state of the currently selected circuit block to be maintained in the Select Register by not forcing the Select Register to reset state, which is useful during interconnectivity testing between multiple cores within a chip.

In certain embodiments, hierarchical addressing allows any selected circuit block to be reset using the Test Mode Select and Test Clock signals. In a preferred embodiment, only the test access port of a selected circuit block will receive such a reset sequence, in the same manner that only selected test access ports receive test vectors. The reset generated using the Test Mode Select and Test Clock signals will not modify the current status of any circuit block other than the circuit block corresponding to the selected address bits. Interconnectivity testing between multiple circuit blocks within a single circuit chip can be accomplished by allowing the Select Registers to be loaded with a new value without modifying the current status of the previously selected circuit block. This allows a currently selected circuit block to be programmed to drive certain values on selected pins of the circuit block, and a new address can optionally be loaded into the Select Registers to select a different circuit block without affecting the state of the currently selected circuit block.

In some embodiments, the Test Reset signal can also be demultiplexed in the same manner as the Test Clock signal, allowing a top-level reset operation to reset only the selected circuit block without resetting any other circuit block in the chip. A reset sequence is sent only to the circuit block corresponding to the address bits of the Select Register, rather than performing a chip-level rest sequence which would reset all circuit blocks of the chip.

In some embodiments, a power-up reset circuit can be used to ensure that the chip-level test access port is selected when a reset sequence is performed after power-up, rather than the circuit block corresponding to the address bits in the Select Register. This is desirable because the contents of the Select Registers (and hence the circuit block selection) may be undetermined at the time of power-up. Among other things, such embodiments provide the flexibility of resetting any given circuit block without affecting the rest of the circuit blocks in the chip.

Further embodiments, variations and enhancements are also described herein.

DETAILED DESCRIPTION OF PREFERRED EMBODIMENTS

Preferred embodiments of the present invention will now be described, with reference as necessary to the accompanying drawings.

Figure 1:
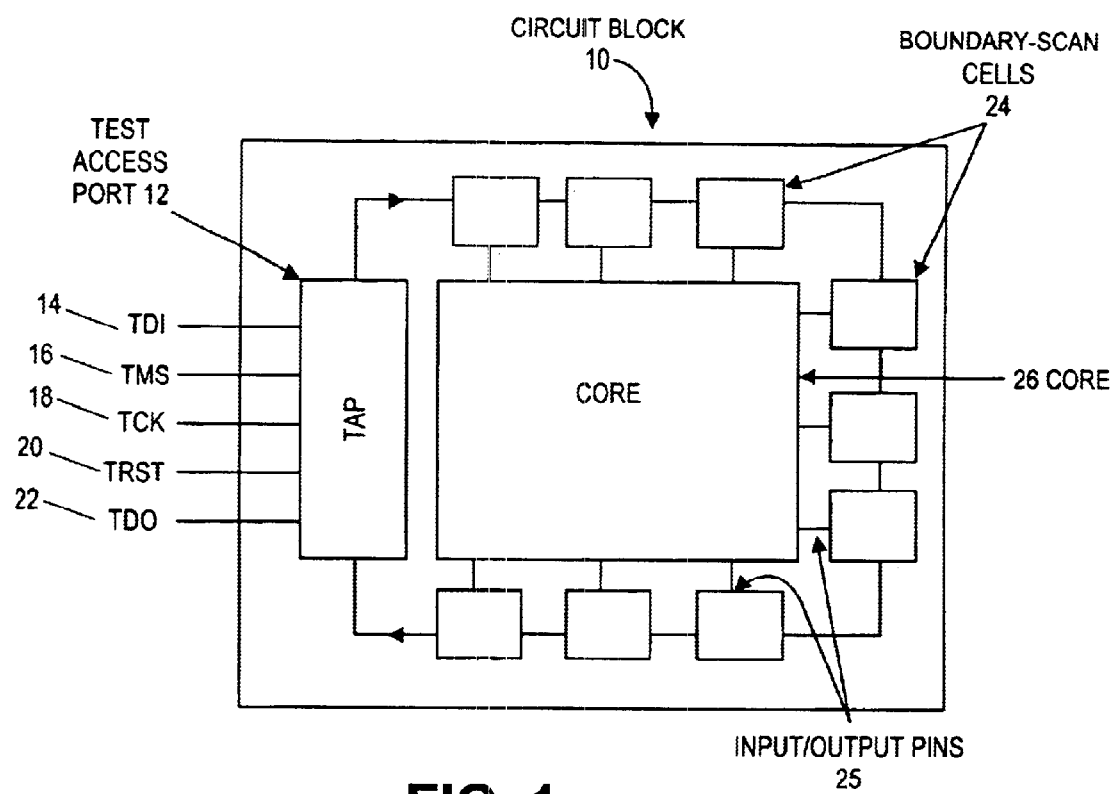
FIG. 1 is a block diagram of a typical circuit block having a core, a test access port, and boundary-scan cells.

FIG. 1 is a block diagram of a "typical" circuit block 10 containing a test access port (TAP) 12 and an embedded core 26 with boundary-scan (BS) cells 24. The circuit block 10 may comprise the entirety of a particular integrated circuit design or chip. The test access port 12 in this example may be a general purpose test access port, based on the IEEE Standard 1149.1 described in IEEE Computer Society, "IEEE Standard Test Access Port and Boundary-Scan Architecture," 1149.1-1990 (including IEEE Std. 1149.1a-1993), published by the Institute of Electrical and Electronics Engineers, Inc., hereby incorporated by reference as if set forth fully herein. The test access port 12 according to IEEE Standard 1149.1 includes several (four or five) dedicated test signal pins: a Test Clock (TCK) signal 18, a Test Mode Select (TMS) signal 16, a Test Data Input (TDI) signal 14, a Test Data Output (TDO) signal 22, and an optional Test Reset (TRST) signal 20. The test access port signals 14, 16, 18, 20 and 22 control a sixteen-state finite state machine generally referred to as a test access port controller (not shown) that operates according to the state diagram described in the aforementioned IEEE Standard 1149.1 article.

The circuit block 10 will usually include the major part of a chip, and might, depending upon the nature of the chip, be used independently or may be intended for use within another larger system. The boundary-scan cells 24 are placed between the test access port 12 and the internal core 26 to control and/or observe signal values present at each input/output pin 25 connecting the boundary-scan cells to the internal core 26. Generally, one boundary-scan cell 24 will be provided for each input/output pin 25 of the internal core 26. The boundary-scan cells 24 are typically connected in series so as to form a scan chain, and may, when so arranged, be collectively referred to as boundary-scan registers or a boundary-scan chain.

To test the embedded core 26, test vectors may be scanned into the boundary-scan registers 24 serially through the test access port 12 so that test stimuli are applied in parallel to the internal core 26 through the input/output pins 25. The response of the core 26 is then captured in parallel by the boundary-scan registers 24. The captured responses are then scanned out serially through the test access port 12.

Figure 2:
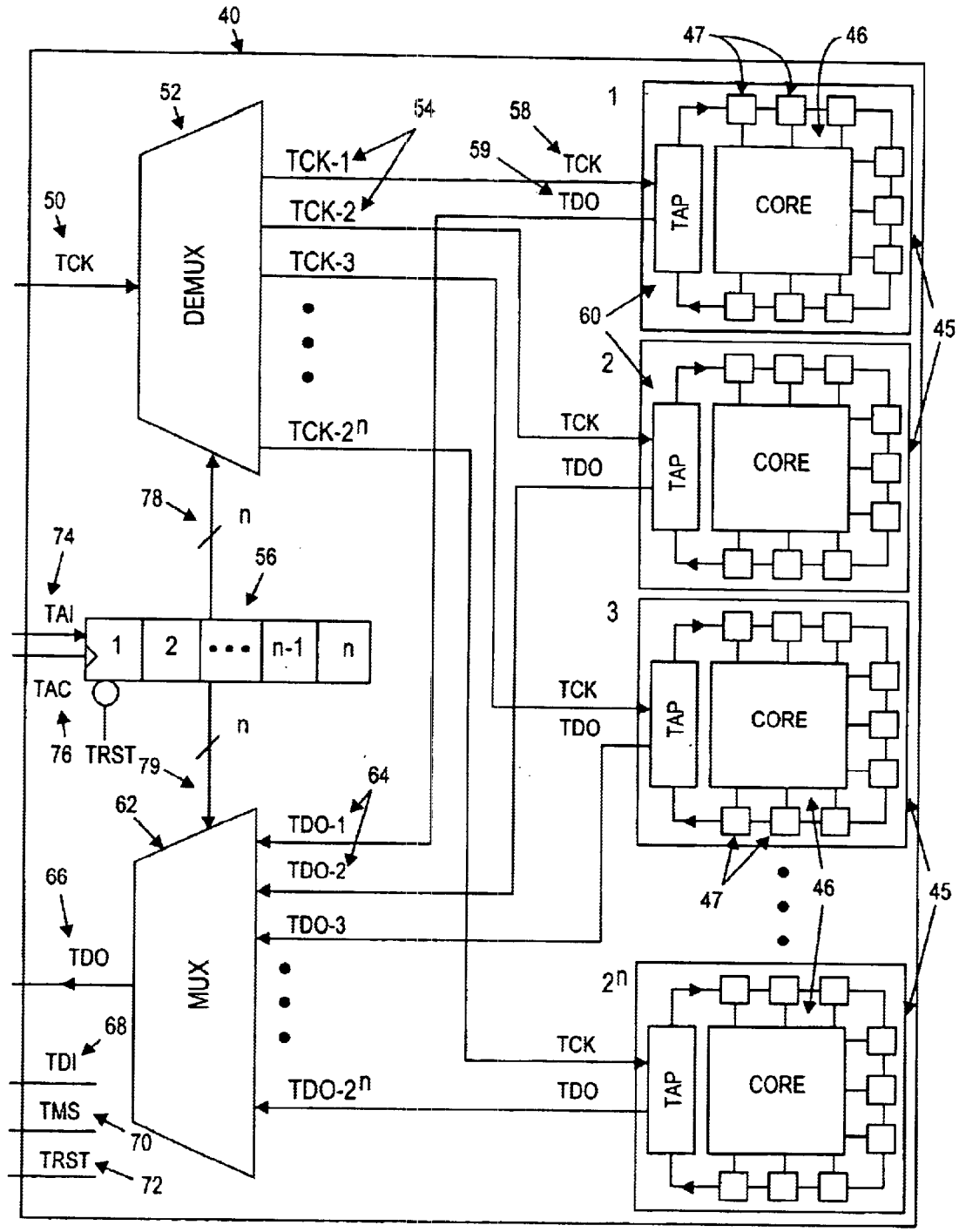
FIG. 2 is an example block diagram of one embodiment of a test circuit for facilitating the testing of multiple circuit block internal cores connected at the same hierarchical level.

FIG. 2 is a block diagram of one embodiment of a test circuit 40 for facilitating the testing of multiple embedded cores connected at the same hierarchical level. As shown in FIG. 2, the test circuit 40 comprises a demultiplexer 52 having a plurality of outputs (labeled TCK-1, TCK-2, ..., TCK-$2^n$) connected to up to $2_n$ internal circuit blocks 45. Each of the circuit blocks 45 may, for example, be constructed generally in accordance with the structure shown in FIG. 1—that is, having an IC core 46, a test access port 60, and a set of boundary-scan cells 47 connected to the core 46. The demultiplexer 52 receives a chip-level input test signal; in this example, a chip-level Test Clock signal (TCK) 50, which is one of the signals provided for by the IEEE 1149.1 test access port specifications. The test circuit 40 also comprises a multiplexer 62, having a plurality of inputs (labeled TDO-1, TDO-2, ..., TDO-$2^n$) connected to the internal circuit blocks 45. The multiplexer 62 outputs a chip-level test output signal; in this example, a chip-level Test Data Output (TDO) signal 66, which is also one of the signals provided for by an IEEE Standard 1149.1 Test Access Port.

As further shown in FIG. 2, a Select Register 56 is connected by n control lines 78, 79 to the select inputs of the demultiplexer 52 and multiplexer 62, respectively. The Select Register 56 preferably is a serial shift register having n bits, each bit providing one of the n control lines 78, 79. The Select Register 56 receives a Test Address Input (TAI) signal 74 under control of a Test Address Clock (TAC) signal 76.

In operation, the chip-level Test Clock signal 50 is preferably demultiplexed and one of the demultiplexer (DEMUX) outputs 54 receives the chip-level Test Clock signal 50 depending on the value present in the Select Register 56. Outputs of the demultiplexer 52 are preferably connected to the Test Clock input 58 of the individual circuit block test access ports 60. Through this method, the selected circuit block receives the chip-level Test Clock signal 50. The Select Register 56 output preferably drives the select input of the multiplexer (MUX) 62, causing the Test Data Output signal 64 coming from the Test Data Output signal 59 of the selected circuit block's test access port 60 (which receives the Test Clock signal 54 from the demultiplexer 52 output) to connect to the chip-level Test Data Output 66. The rest of the signals, Test Data Input 68, Test Mode Select 70, and Test Reset 72 are common to all the test access ports 60, and are preferably connected directly to their respective chip-level pins.

In a preferred embodiment of the present invention, when the Test Clock input signal 58 of a circuit block 45 is connected to the $j^{th}$ output 54 of the demultiplexer 52, where $1<=j<=2^n$, and n is equal to the number of bits in the Select Register 56, the TDO output signal 59 from the circuit block 45 will preferably be connected to the jth input 64 of the multiplexer 62, as illustrated in FIG. 2. In other embodiments of the hierarchical addressing scheme, when the number of Test Clock outputs 54 from the demultiplexer 52 are not equal to the number of TDO inputs 64 to the multiplexer 62, the maximum number of circuit blocks 45 that can successfully be connected to form a hierarchy is limited to the lower of either of these two numbers (i.e., demultiplexer's 52 outputs and multiplexer's 62 inputs). For example, if the demultiplexer 52 has nine outputs while the multiplexer 62 has sixteen inputs, only nine circuit blocks can be connected in the hierarchical addressing scheme using those demultiplexer/multiplexer pairs.

The multiplexing and demultiplexing hierarchical addressing scheme illustrated in FIG. 2 can itself contain boundary-scan cells and a test access port controller (not shown), creating a multi-level addressing scheme. In such an embodiment, higher-level test access ports are themselves treated as circuit blocks at that hierarchical level. The Test Clock signal 58 for a higher-level test access port is preferably connected to one of the Test Clock outputs 54 of the demultiplexer 52, and the Test Data Output signal 59 of a higher-level test access port is preferably connected to one of the TDO input signals 64 to the multiplexer 62. Connecting the chip-level test access port at TAP-1 (i.e., connecting using TCK-1 and TDO-1) has the advantage of allowing the chip (or higher-level circuit block) to behave as if it contains only one top-level test access port, making this arrangement compliant with IEEE 1149.1 test access port specifications. This is accomplished by sending a reset signal to the chip-level Test Reset pin 72, which is operably connected to the Select Register's 56 clear input. The reset operation, accomplished via system power-up or Test Reset signal, clears all bits in the Select Register 56, setting the chip or circuit block 45 to an initial state, which defaults to selecting the top-level test access port.

Figure 8:
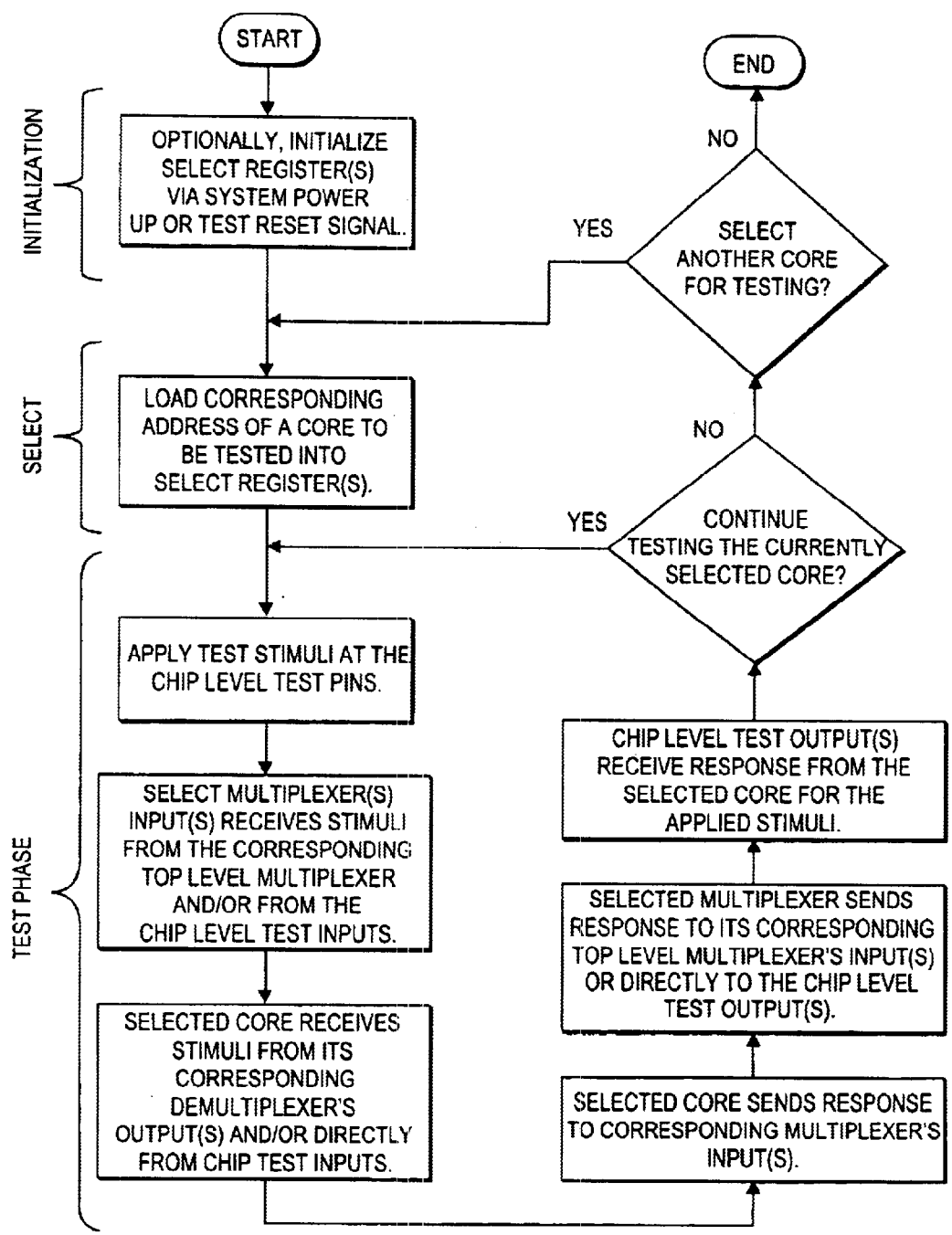
FIG. 8 is a flow chart diagram depicting the steps of a preferred embodiment of the hierarchical addressing scheme used to test embedded cores.

FIG. 8 shows a flow chart depicting the steps of a preferred embodiment of the hierarchical addressing scheme used to test embedded cores in an integrated circuit. Any circuit block in a chip may be selected for test access to its internal core by serially loading the corresponding address bits of the circuit block test access port into the circuit block Select Register. Initialization of the Select Register via system power-up or the Test Reset signal can also be incorporated in order to ensure a known circuit block is selected during power-up. The Test Reset signal is optional for any IC system, and is not required in the IEEE 1149.1 standard specification.

If a Test Reset signal is available, it should be connected to the clear input of all Select Registers in order to initialize the registers during a Test Reset operation. If a Test Reset signal is not supported by the integrated circuit or circuit block being tested, but a power-up reset signal is available, the power-up reset signal will preferably be connected to the clear input of all Select Registers so that at power-up, the contents of all registers will be cleared. If both Test Reset and power-up reset signals are available, the circuit illustrated in FIG. 7 can be used to generate a final Test Reset signal that can be connected to all Select Register clear inputs to initialize the Select Registers during power-up. If neither Test Reset nor power-up reset are available on the integrated circuit being tested, the Select Registers are preferably initialized by loading them with known values, using the Test Address Input and Test Address Clock signals.

Figure 3:
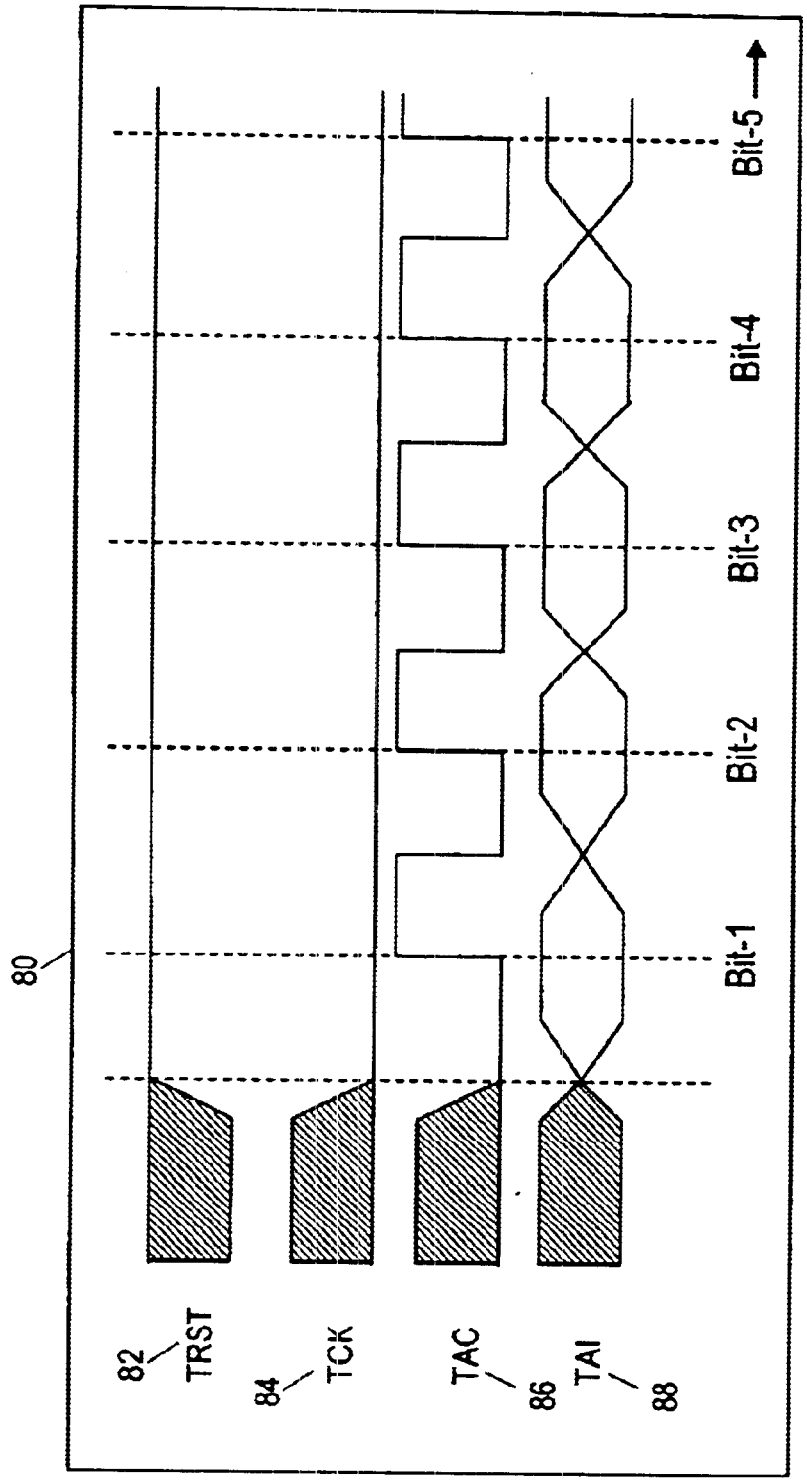
FIG. 3 is timing diagram illustrating various signals used in connection with loading test access port address bits into one or more Select Registers.

A test access port can be in any state after power up, but can be programmed to a known state by selecting the test access port using the Test Address Input and Test Address Clock signals, and by using the Test Clock and Test Mode Select signals to program the selected test access port. The signal states preferably used to load the circuit block Select Registers are illustrated in FIG. 3. As previously mentioned, the circuit block address bits are loaded through the Test Address Input (TAI) pin 88 on the rising edge of the Test Address Clock (TAC) signal 86, while maintaining the Test Clock signal 84 in a logic-low state and the Test Reset signal 82 in a logic-high state. If a Test Reset signal 82 is supported by the integrated circuit or circuit block being tested, it can be used to clear Select Register bits, causing the top-level test access port to be used as the default test access port, which would then receive the test pattern inputs.

As FIG. 3 illustrates, the Test Reset signal 82 should be kept at a logic-high state while loading circuit block address bits into the Select Registers in order to avoid forcing the Select Registers to contain logical zeros. As previously discussed, the process of clearing the Select Registers via the global Test Reset signal 82 prior to loading the address bits of a selected circuit block may be omitted. By omitting this process, the state of the currently selected Test Access Port may be maintained without forcing it to reset, while a new value is loaded into the Select Registers to select a different Test Access Port. This approach is useful to facilitate inter-connectivity testing, as will be detailed later in this description.

Figure 4:
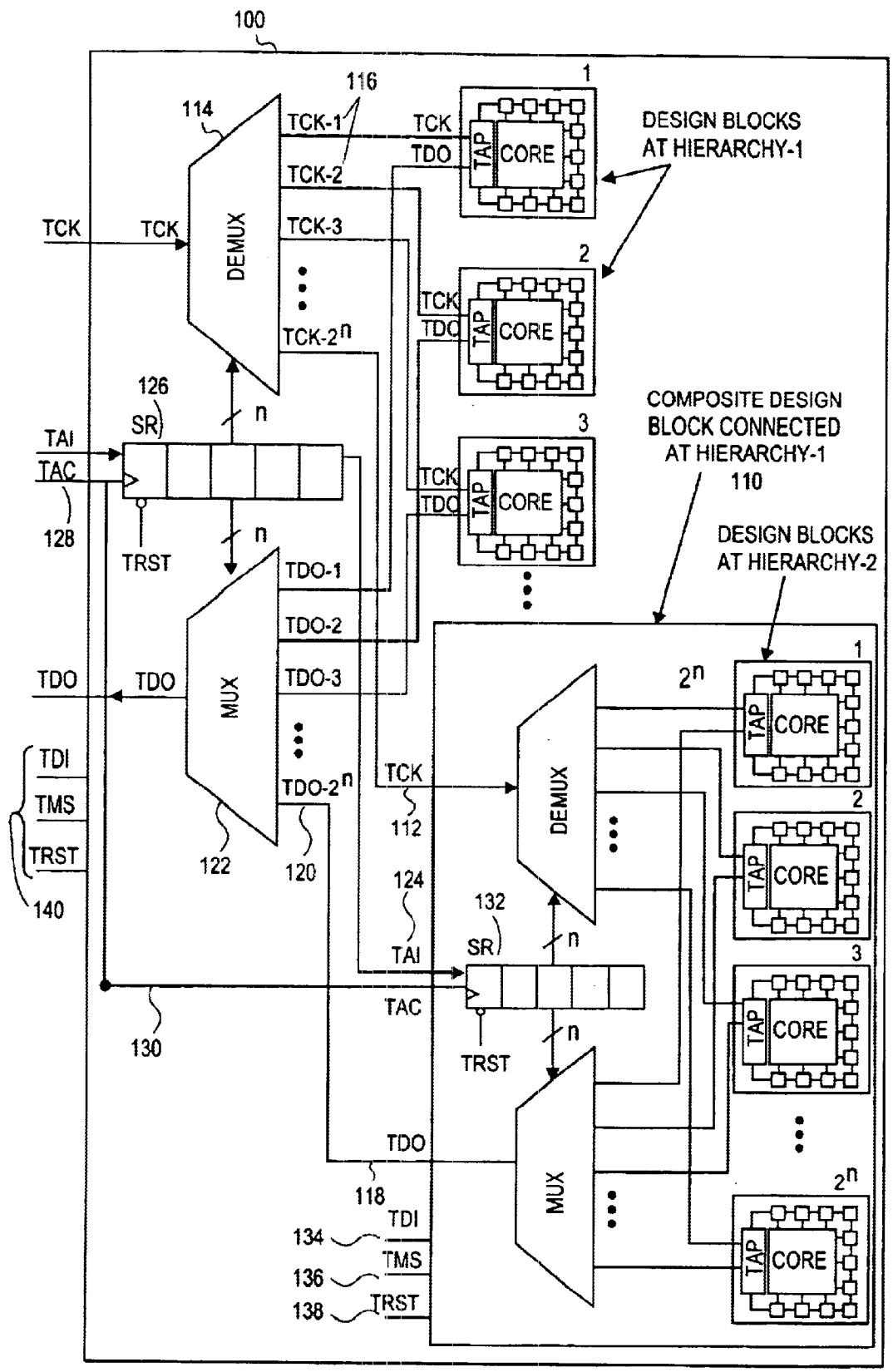
FIG. 4 is an example block diagram of a circuit for testing multiple circuit block internal cores grouped in a multi-level hierarchy within an integrated circuit.

In a preferred embodiment, the hierarchical addressing scheme may be extended to test the embedded cores of multi-level hierarchical structures formed by a plurality of circuit blocks similar to the structure shown in FIG. 2. The design shown in FIG. 2 allows for reuse of circuit blocks because the previously formed hierarchy in a composite block can be a subblock of a higher-level complex structure. The hierarchical addressing scheme supports such reuse, and treats composite circuit blocks (i.e., circuit blocks formed by multiple hierarchies) as simply a single circuit block at an higher-level hierarchy. Such a multi-level hierarchical structure is illustrated in FIG. 4. The hierarchical addressing scheme is preferably achieved by connecting the Test Clock input 112 of a composite block 110 to one of an upper hierarchy demultiplexer's 114 Test Clock outputs 116, and by connecting the TDO output 118 of the composite block 110 to the corresponding TDO input 120 of the upper hierarchy multiplexer 122. Preferably, the TAI input 124 of the lower hierarchy block 110 is driven by the output of the Select Register 126 of the higher-level hierarchy (acting as a first in, first out queue). Because TAC 128, 130 is a common signal (similar to Test Data Input, Test Mode Select, or Test Reset), the TAC inputs 130 of each Select Register 126, 132 are preferably connected to the chip-level TAC 128 directly. The Test Data Input 134, Test Mode Select 136, and Test Reset 138 inputs of the lower-level hierarchy 110 are also connected to their respective signals 140 at the chip-level.

Various embodiments as disclosed herein may provide the advantage of allowing any selected test access port to be reset using the Test Mode Select and Test Clock signals. In a preferred embodiment, only the test access port of a selected circuit block will receive the reset sequence by Test Mode Select and Test Clock signals, in the same manner that only the selected test access ports receive test vectors. Preferably, the reset generated using the Test Mode Select and Test Clock signals will not reset any other circuit block test access, other than the test access ports corresponding to the selected address bits. Thus, if the top-level test access port is selected prior to the Test Mode Select and Test Clock generated reset, only the top-level test access port will be reset.

Figure 5:
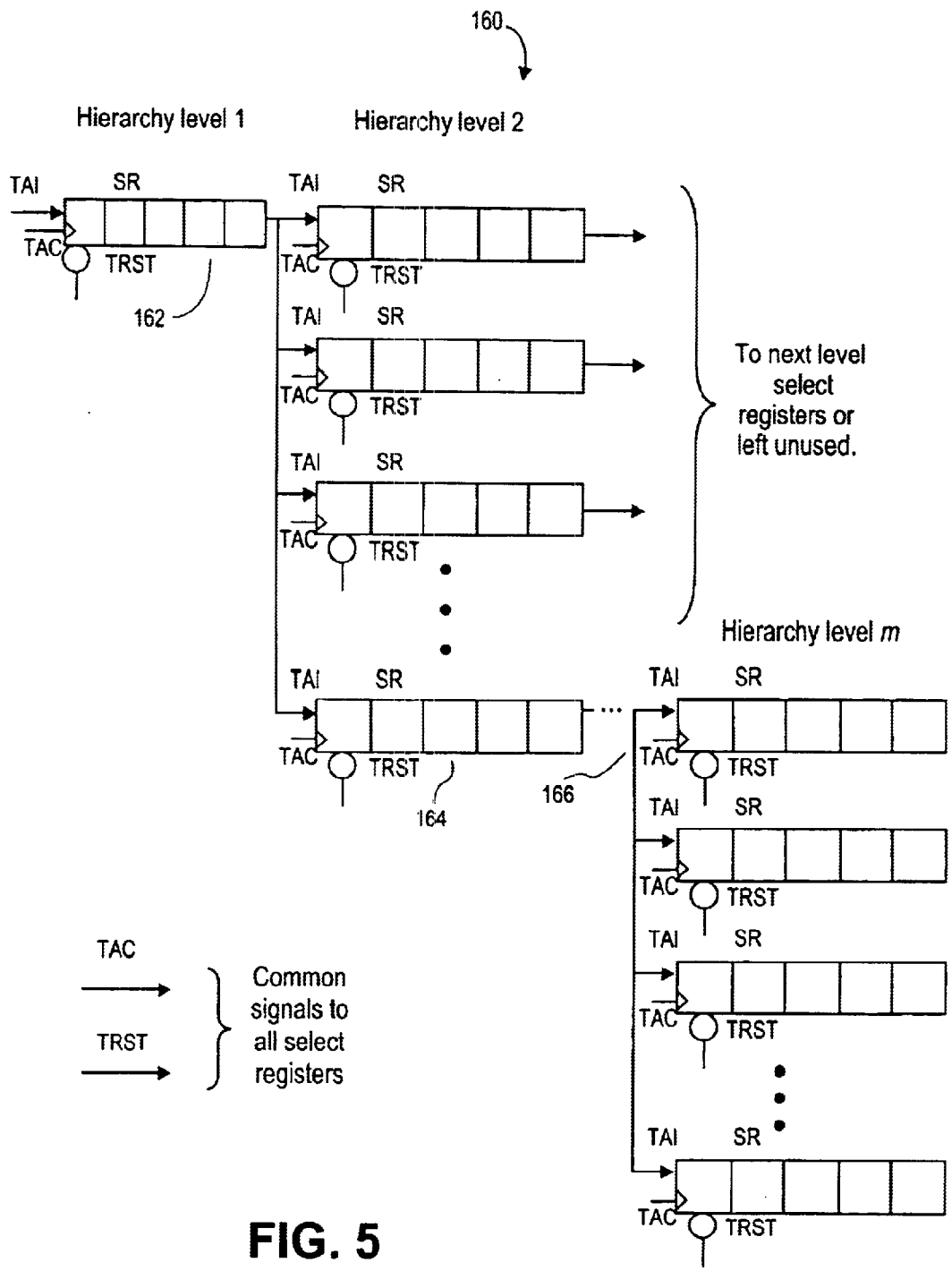
FIG. 5 is an example circuit diagram of Select Registers linked together, as may be employed in a multi-level hierarchical test circuit structure.

In a preferred embodiment, test access to individual circuit blocks from the chip-level is accomplished by loading the desired address bits serially in the Select Registers. Once the desired circuit block test access port is selected, the test vectors for the selected circuit block are preferably applied through the chip-level test access port. Testing can then be performed as if the selected circuit block is the only block in the entire chip, supporting the IEEE 1149.1 standard which assumes one Test Access Port per chip or design. The select and test mechanism presented here extends the applicability of the IEEE 1149.1 standard to the chips having multiple cores with their own individual IEEE 1149.1 standard Test Access Port. FIG. 5 shows a preferred embodiment of the connecting structure for Select Registers 160 in a multiple hierarchical system. For purposes of illustration, all Select Registers shown in FIG. 5 are assumed to be five bits in length.

In a preferred embodiment, the address length for a circuit block is variable, depending on which circuit block is selected for core testing. The maximum address length for any circuit block is the sum of the address lengths of the individual Select Registers (e.g., Select Registers 162, 164, 166 shown in FIG. 5) in the longest chain. The maximum length of the address that can uniquely select a circuit block for testing can be computed for the structure 160 illustrated in FIG. 5. For m level of hierarchies, the maximum number of address bits $a_{max}$ is given by the following equation:

$$a_{\max} = \sum_{k=1}^{m} n_k$$

Where k is the hierarchy number ranging from 1 to m, and n is the maximum number of bits in a Select Register at a given hierarchy k. Due to the nature of the hierarchical addressing scheme, the value of the address length a can be smaller for the test access ports residing closer to the top-level hierarchy. Under this scheme, the maximum address bits, $a_x$, required to select any given test access port at a hierarchy x, where 1<=x<=m, is given by the following equation:

$$a_x = \sum_{k=1}^{x} n_k \qquad 1 <= x <= m$$

Preferably, address bits are loaded using the Test Address Clock signal, TAC, whose period is $t_{TAC}$. The access time, t, for any given test access port is therefore given by:

$$t = a * t_{TAC}$$

where a is the number of address bits required to select the given test access port.

In a preferred embodiment, all Select Registers in a given hierarchy k point to a corresponding test access port connected at that hierarchy (k). Preferably, the contents of the Select Register present at the next higher-level hierarchy (k−1) determines which lower-level Select Register is considered. The following example will illustrate how to select a particular circuit block within a chip using the hierarchical addressing scheme of the present invention.

Figure 6:
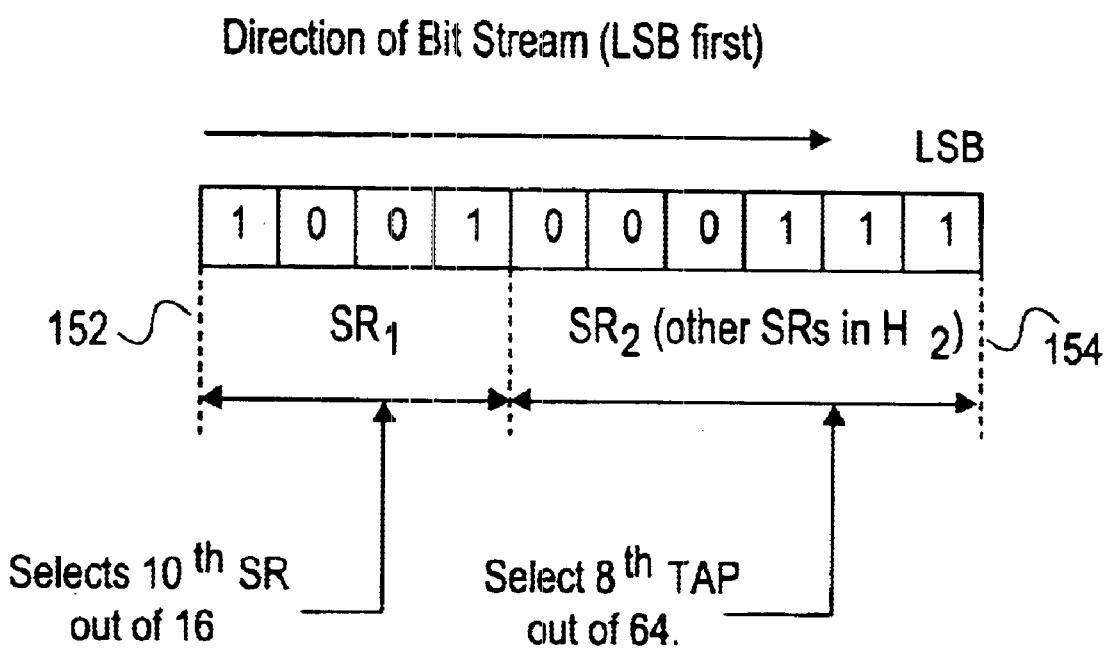
FIG. 6 is a diagram of an example of a serial address pattern format as may be used in certain embodiments to select a circuit block in a two-level hierarchy.

The diagram of FIG. 6 will be used to illustrate the following example. If it is assumed that the top-level Select Register 152 (SR$_1$) in a multi-level hierarchy is 4 bits in length, then that register is capable of selecting as many as $2^4=16$ individual or composite circuit blocks connected to it. If all the circuit blocks connected to SR$_1$ 152 are composite designs, and each Select Register at the lower-level hierarchy 154 (SR$_2$) are six bits in length, there can be a maximum of $2^4*2^6=1024$ test access ports connected in this example hierarchical scheme. There will be sixteen Select Registers at the lower-level hierarchy 154 connected to SR$_1$ 152. Any of the circuit blocks (accessible via their test access ports) at the lower-level SR$_2$ hierarchy 154 may be selected by serially loading the corresponding Select Register chain of length 4+6=10 bits.

If, for example, it is desired to select the 8$^{th}$ test access port under the 10$^{th}$ Select Register in the lower hierarchy 154 of the above described scheme, the bit stream for the serial address of ten bits will be as shown in FIG. 6. Preferably, all Select Registers at the lower-level SR$_2$ hierarchy 154 will have the same value (i.e., 000111 binary, indicating the 8$^{th}$ test access port out of the 64 test access ports connected to each SR$_2$ 154). In this example, binary 000000 corresponds to the first test access port, binary 000001 corresponds to the second test access port, binary 000010 corresponds to the third test access port, and so on. Preferably, the higher-level Select Register determines which Select Register at the lower-level is qualified with its selection. In this example, SR$_1$ 152 is set to 1001 binary and qualifies the 10$^{th}$ Select Register's selection of hierarchy two. In this example it takes at most ten TAC cycles to make the selection by loading one Select Register bit per clock cycle for both SR$_1$ 152 and SR$_2$ 154. However, if there are one or more individual circuit blocks connected at the upper hierarchy (i.e., SR$_1$ 152), only SR$_1$ 152 needs to be loaded to select a desired individual circuit block for testing at hierarchy one. The time needed to select an individual circuit block under SR$_1$ 152 in this example is only the time needed to load SR$_1$ 152 alone. If the Select Register length is four bits, for example, it takes four TAC clock cycles to select an individual circuit block at the upper hierarchy. In a preferred embodiment, a faster clock speed than the Test Clock can be used on the Test Address Clock in order to reduce the selection time to a fraction of a Test Clock period. This can be accomplished because the Test Clock usually operates at a lower frequency, and the Test Address Clock can be independent of the Test Clock.

In addition to testing the internal cores of individual circuit blocks through the chip-level test access port, a preferred embodiment of the hierarchical addressing scheme supports interconnectivity testing between the multiple circuit blocks within the integrated circuit. Preferably, this functionality is enabled by allowing the Select Registers (e.g., Select Registers 162, 164, 166 shown in FIG. 5) to be loaded with a new value without modifying the current status of the previously selected circuit block. This embodiment allows programming a selected circuit block to drive certain values on selected pins of the design. Preferably, the pin connectivity between the newly selected circuit block and the previously selected circuit block is verified by reading the boundary-scan chain of the newly selected circuit block. Access time is usually insignificant compared to the time required for scan operations and testing; therefore, loading the Select Registers each time to access a different circuit block is not a major consideration as far as test time is concerned.

The hierarchical addressing scheme described herein provides a high degree of flexibility and control over selection and access to any individual test access ports in a complex circuit chip. Further, the state of a selected test access port is preserved when the test access port is deselected as the Test Clock signal that advances the test access port is withdrawn. In a preferred embodiment, the Test Reset signal can be used to a synchronously reset all the test access ports on the chip, as discussed below. Preferably, switching to a new test access port is performed after keeping the existing test access port in its current state so that interconnectivity testing can be carried out properly.

In a preferred embodiment, the top-level Test Reset signal is connected to the test access port of every circuit block in the hierarchy. Such a design will cause every test access port in the circuit design to be reset when a reset operation is performed using the top-level Test Reset signal.

In an alternative embodiment, if global Test Reset capability is not desired, the Test Reset signal may be demultiplexed in a manner similar to the Test Clock signal, as previously described. In this alternative embodiment, a top-level reset operation results in resetting a selected test access port only, based on the address bits loaded into the Select Registers, and will not reset any other test access ports in the integrated circuit. Such a process can cause unpredictable results if the reset sequence is performed just after power-up, because the contents of the Select Registers may be undetermined at that point and therefore the test access port selection may be unknown. In order to ensure the chip-level test access port is selected after power-up, a preferred embodiment includes a power-up reset circuit as described in the aforementioned IEEE Standard 1149.1 specification. Such a circuit diagram is illustrated in FIG. 7.

Figure 7:
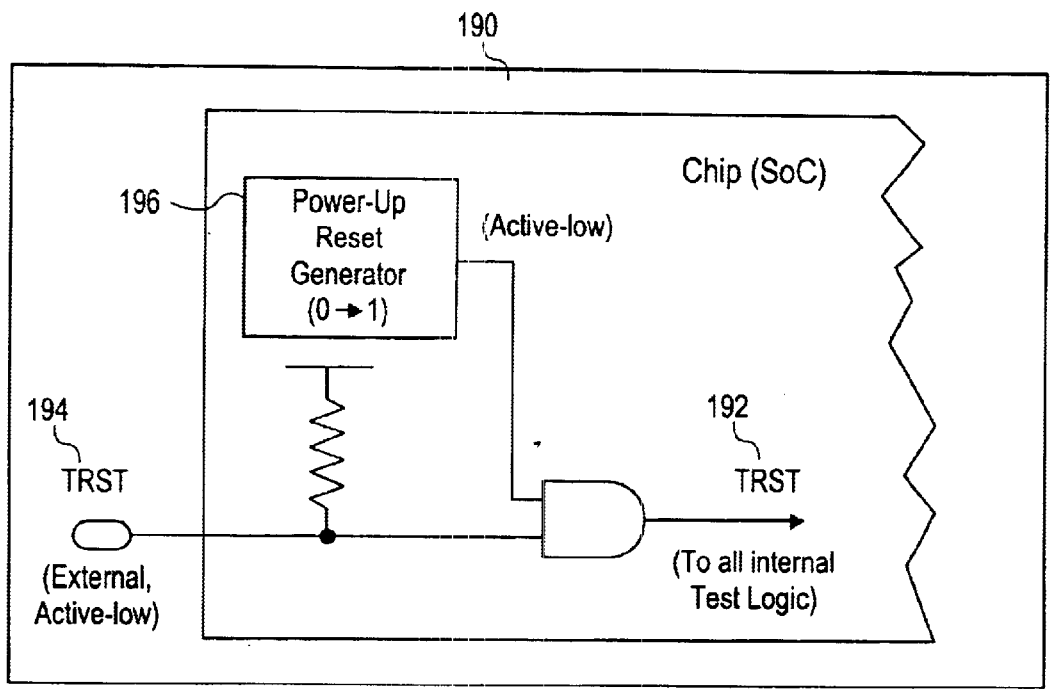
FIG. 7 is a block diagram of a power-up reset circuit as may be used in a test circuit having a hierarchical structure as described herein.

In the embodiment shown in FIG. 7, the power-up reset circuit 190 causes the Test Reset signal 192 internal to the chip to perform as a function of the external Test Reset signal 194 and the internal power-up reset signal 196. Because any selected test access port controller can synchronously enter the Test-Logic-Reset state following five rising edges on the Test Clock signal (while the Test Mode Select signal is maintained at logic-high state), use of a power-up reset circuit also works without the dedicated Test Reset pin for the selected test access port. Further, this method provides the flexibility of resetting any given test access port without affecting other test access ports in the chip. This functionality is highly useful for interconnectivity testing, as previously described, because it allows a selected test access port to be set to a known state without affecting the other test access ports of the chip. In another preferred embodiment, the power-up reset circuitry 190 may be used to clear the Select Registers, thereby setting the top-level test access port as the default test access port after power-up, and any synchronous reset (using the Test Mode Select and Test Clock signals) immediately following power-up will reset the top-level test access port, even if there is no dedicated Test Reset pin. This operation makes the hierarchy perform as if only the top-level test access port is present at power-up making the scheme compatible with the IEEE 1149.1 standard.

Various embodiments as disclosed herein may provide one or more of the following advantages or benefits:

- No modifications to the test access ports of pre-existing circuit blocks are necessary
- Original test vectors designed for the core (i.e., circuit block) can be reused without modification when the core is reused in a new integrated circuit design
- Design simplicity requiring minimal engineering effort to implement
- No complex or special software tools required
- Minimum area overhead (particularly as compared to conventional methodologies)

No complex controllers required at each level of hierarchy

Scaleable for any design complexity or size

Hardened blocks can be used with no extra test access port controller

Minimal number of additional pins (i.e., two) are needed at the chip-level, and the number is independent of the number of circuit blocks inside the chip Few internal signals required (especially as compared to conventional methodologies)

Simple access mechanism

Allows interconnectivity testing between individual circuit blocks within a chip Moreover, various embodiments as described herein may be used in a manner compliant with widely accepted IEEE 1149.1 standard specifications.

While various embodiments have been described herein with reference to specific types of circuits (e.g., shift registers, multiplexers, demultiplexers, etc.), it will be appreciated by those skilled in the art that a variety of other types of circuits may be used providing similar functionality. Therefore, the invention is not to be confined to the specific circuits shown in the examples herein. In addition, while various embodiments have been described with respect to the IEEE 1149.1 standard and specific signal types relevant thereto (e.g., Test Data Input, Test Data Output, Test Clock, Test Reset, etc.), the principles described herein may be used in connection with the provision of any type of input signals or output signals requiring routing to multiple embedded circuit blocks.

While preferred embodiments of the invention have been described herein, many variations are possible which remain within the concept and scope of the invention. Such variations would become clear to one of ordinary skill in the art after inspection of the specification and drawings. The invention is not to be restricted except within the spirit and scope of any appended claims.

What is claimed is:

1. A circuit for facilitating the testing of an integrated circuit that is comprised of multiple circuit blocks, each of the circuit blocks including a test access port, the circuit comprising:

a demultiplexer connected to a chip-level test input signal, said demultiplexer having a plurality of outputs connected to said circuit blocks;

a multiplexer connected to a chip-level test output signal, said multiplexer having a plurality of inputs received from said circuit blocks; and a select register connected to said demultiplexer and to said multiplexer, said select register routing the input of said demultiplexer to the output of said demultiplexer and the input of said multiplexer to the output of said multiplexer according to a plurality of bits loaded into the select register.

2. The circuit of claim 1, wherein said select register comprises a serial register.

3. The circuit of claim 1, wherein said chip-level test input signal comprises a master test clock input signal, and wherein said chip-level test output signal comprises a master test data output signal.

4. The circuit of claim 3, further comprising a test data input signal connected to each of said circuit blocks.

5. The circuit of claim 4, wherein the test access part of each of the multiple circuit blocks of said integrated circuit is compliant with IEEE Standard 1149.1.

6. The circuit of claim 4, wherein said select register receives as an input a test address input signal, said test address signal comprising address bits corresponding to addresses assigned to the multiple circuit blocks of said integrated circuit.

7. The circuit of claim 6, wherein said select register further receives as an input a test address clock signal for clocking in said address bits into the select register.

8. An integrated circuit having multiple embedded cores, each of the embedded cores including a test access port, the integrated circuit further comprising:

a demultiplexer connected to a chip-level test input signal, said demultiplexer having a plurality of outputs, each of said outputs connected to the test access port of one of the embedded cores;

a multiplexer connected to a chip-level test output signal, said multiplexer having a plurality of inputs, each of said inputs connected to the test access port of one of the embedded cores; and a select register connected to said demultiplexer and to said multiplexer, said select register routing the input of said demultiplexer to the output of said demultiplexer and the input of said multiplexer to the output of said multiplexer according to a plurality of bits loaded into the select register such that the selected output and the selected input are connected to the same embedded core.

9. The integrated circuit of claim 8, wherein said select register comprises a serial register.

10. The integrated circuit of claim 8, wherein said chip-level test input signal comprises a master test clock input signal, and wherein said chip-level test output signal comprises a master test data output signal.

11. The integrated circuit of claim 10, further comprising a test data input signal connected to the test access port of each of said embedded cores.

12. The integrated circuit of claim 11, wherein the test access port of each of the embedded cores is compliant with the IEEE Standard 1149.1.

13. The integrated circuit of claim 11, wherein said select register receives as an input a test address input signal, said test address input signal comprising address bits corresponding to unique addresses assigned to the embedded cores.

14. The integrated circuit of claim 13, wherein said select register further receives as an input a test address clock signal for clocking in said address bits into the select register.

15. An integrated circuit having multiple embedded cores, each of the embedded cores including a test access port the integrated circuit further comprising:

a demultiplexer having outputs connected to the test access ports of a first group of embedded cores;

a top-level demultiplexer connected to a chip-level test input signal, said demultiplexer having a plurality of top-level demultiplexer outputs connected to the test access port of a second group of embedded cores distinct from said first group of embedded cores and to an input of said demultiplexer;

a multiplexer having inputs received from the test access ports of said first group of embedded cores;

a top-level multiplexer connected to a chip-level test output signal, said top-level multiplexer having a plurality of top-level multiplexer inputs connected to the test access ports said second group of embedded cores and to an output of said multiplexer;

a first select register connected to said demultiplexer and to said multiplexer, said first select register routing the input of said demultiplexer to the output of said demultiplexer and the input of said multiplexer to the output of said multiplexer such that the selected output and the selected input are connected to the same embedded core; and a second select register connected to said top-level demultiplexer and to said top-level multiplexer, said second select register routing the input of top-level demultiplexer to the output of said top-level demultiplexer and the input of said top-level multiplexer to the output of said top-level multiplexer such that the selected top-level demultiplexer output and the selected top-level multiplexer input are connected either to the same embedded core or to said demultiplexer and multiplexer, respectively.

16. The integrated circuit of claim 15, further comprising:

a second demultiplexer having outputs connected to the test access ports of a third group of embedded cores;

a second multiplexer having inputs received from the test access ports of said third group of embedded cores; and a third select register connected to said second demultiplexer and to said second multiplexer, said third select register routing the input of said second demultiplexer to the output of said second demultiplexer and the input of said second multiplexer to the output of said second multiplexer such that the selected output and the selected input are connected to the same embedded core in said third group of embedded cores;

wherein one of said top-level demultiplexer outputs is connected to said second demultiplexer, one of said top-level multiplexer inputs is received from said second multiplexer, and wherein said second select register selects the top-level demultiplexer output of said top-level demultiplexer and the top-level multiplexer input of said to level multiplexer such that the selected top-level demultiplexer output and the selected top-level multiplexer input are connected either to the same embedded core, to said demultiplexer and multiplexer, respectively, or to said second demultiplexer and said second multiplexer, respectively.

17. The integrated circuit of claim 15, wherein said first select register comprises a first serial shift register, and wherein said second select register comprises a second serial shift register.

18. The integrated circuit of claim 15, wherein said chip-level test input signal comprises a master test clock input signal, and wherein said chip-level test output signal comprises a test data output signal.

19. The integrated circuit of claim 18, further comprising a test data input signal connected to the test access port of each of said embedded cores.

20. The integrated circuit of claim 19, wherein the test access port of each of the embedded cores is compliant with IEEE Standard 1149.1.

21. The integrated circuit of claim 19, wherein said second select register receives as an input a chip-level test address input signal, said test address input signal comprising address bits corresponding to unique addresses assigned to the embedded cores.

22. The integrated circuit of claim 21, wherein an output of said second select register is connected as an input to said first select register.

23. The integrated circuit of claim 21, wherein said second select register further receives as an input a test address clock signal for clocking in said address bits into the second select register.

24. A method of testing circuit blocks embedded within an integrated circuit, the method comprising the steps of:

loading address data bits corresponding to a selected circuit block into at least one select register;

receiving at least one test input data signal for a selected circuit block, based on the address bits of said at least one select register;

demultiplexing the at least one test input data signal;

sending the at least one demultiplexed test input data signal to the selected circuit block based on the address bits of the at least one select register;

receiving test result signals from the circuit blocks; and multiplexing the test result signals based upon the address bits of the at least one select register.

25. The method of claim 24, further comprising the step of processing the test result signals to evaluate circuit block operation and connectivity.

26. The method of claim 24, further comprising the step of resetting a selected circuit block to a known state based on the address data loaded into the at least one select register.

27. The method of claim 26, wherein only the circuit blocks corresponding to the address data loaded into the one or more select registers are reset to an initial state.

28. The method of claim 24, wherein test access to the circuit blocks is accomplished via a test access ports in the individual circuit blocks.

29. The method of claim 24, wherein test access to at least one circuit block is accomplished via a chip-level test access port and a lower-level test access port embedded in the at least one circuit block.

* * * * *

UNITED STATES PATENT AND TRADEMARK OFFICE
CERTIFICATE OF CORRECTION

PATENT NO. : 6,686,759 B1
DATED : February 3, 2004
INVENTOR(S) : Janardhana Swamy It is certified that error appears in the above-identified patent and that said Letters Patent is hereby corrected as shown below:

Column 13,
Line 63, replace "part" with -- port --

Column 14,
Line 48, replace "port the" with -- port, the --

Column 15,
Line 35, replace "to level" with -- top-level --

Signed and Sealed this

Sixth Day of July, 2004

JON W. DUDAS
*Acting Director of the United States Patent and Trademark Office*